United States Patent
Lee

(10) Patent No.: US 7,364,968 B2
(45) Date of Patent: Apr. 29, 2008

(54) CAPACITOR IN SEMICONDUCTOR DEVICE AND MANUFACTURING METHOD

(75) Inventor: Jae Suk Lee, Seoul (KR)

(73) Assignee: Dongbu Hitek Co. Ltd., Seoul (KR)

( * ) Notice: Subject to any disclaimer, the term of this patent is extended or adjusted under 35 U.S.C. 154(b) by 0 days.

(21) Appl. No.: 11/611,679

(22) Filed: Dec. 15, 2006

(65) Prior Publication Data

US 2007/0152296 A1   Jul. 5, 2007

(30) Foreign Application Priority Data

Dec. 29, 2005   (KR) .................... 10-2005-0134350

(51) Int. Cl.
*H01L 21/8242* (2006.01)

(52) U.S. Cl. ................ 438/255; 438/660; 257/E21.013

(58) Field of Classification Search ................ 438/255, 438/660, 665, 964; 257/E21.013
See application file for complete search history.

(56) References Cited

U.S. PATENT DOCUMENTS

| 6,677,217 B2 * | 1/2004 | Joo et al. ................ 438/255 |
| 6,743,678 B2 * | 6/2004 | Lee et al. ................ 438/257 |
| 6,773,984 B2 * | 8/2004 | Srividya et al. ........... 438/243 |

* cited by examiner

*Primary Examiner*—Chandra Chaudhari
(74) *Attorney, Agent, or Firm*—Sherr & Nourse, PLLC

(57) ABSTRACT

The capacitor in a semiconductor device includes a substrate, a lower electrode formed over the substrate, a diffusion barrier formed over the lower electrode, a plurality of agglomerates formed over the diffusion barrier, a dielectric layer formed over the surface of the agglomerates to form an uneven surface, and an upper electrode formed over the dielectric layer.

9 Claims, 2 Drawing Sheets

CAPACITOR IN SEMICONDUCTOR DEVICE AND MANUFACTURING METHOD

The present application claims priority under 35 U.S.C. 119 and 35 U.S.C. 365 to Korean Patent Application No. 10-2005-0134350 (filed on Dec. 29, 2005), which is hereby incorporated by reference in its entirety.

BACKGROUND

With the increasingly large scale of integration of semiconductor devices, the space for forming capacitors is decreasing. Therefore, intense research efforts have been directed toward assuring sufficient capacitance in the space available.

The capacitance of a capacitor is determined by the area of the electrodes, the dielectric constant of a dielectric layer, and the distance between electrodes. Accordingly, in order to increase the capacitance, methods of increasing the effective area of a capacitor, of decreasing the thickness of a dielectric layer between two electrodes, and of replacing the dielectric layer with a material having a high dielectric constant have been intensively and extensively studied.

The method of increasing the effective area takes chip real estate away from other devices, due to the high degree of integration and miniaturization. A better solution is to increase the capacitance through optimizing the layering process. However, it becomes difficult to deposit the upper film and the structure becomes complicated, thereby resulting in a difficult manufacturing process. Further, when the dielectric constant is increased or the thickness of the dielectric layer is decreased, leakage current may be increased and faulty devices may result from electrical breakdown or the like.

SUMMARY

Embodiments relate to a capacitor in a semiconductor device and a manufacturing method thereof, and more particularly, to a capacitor having a structure of metal/insulator/metal (MIM) and a manufacturing method thereof.

Embodiments relate to a capacitor with greater capacitance and which avoids the production of faulty devices.

Embodiments relate to a capacitor in a semiconductor device, comprising a substrate, a lower electrode formed over the substrate, a diffusion barrier formed over the lower electrode, a plurality of agglomerates formed over the diffusion barrier, a dielectric layer formed along the surface of the agglomerates to thus form an uneven surface, and an upper electrode formed over the dielectric layer.

The agglomerates may comprise a low-melting-point metal, and the low-melting-point metal may be Sn or Zn.

The dielectric layer may comprise at least one selected from among $Si_3N_4$, $SiO_2$, $Ta_2O_5$, $TiO_2$, PZT, PLZT, and $BaTiO_3$.

The diffusion barrier may comprise Ru or $RuO_2$.

The agglomerates may have a spherical shape, and the projected area of all of the agglomerates may constitute 50~60% of the area of the diffusion barrier.

Embodiments relate to a method of manufacturing a capacitor in a semiconductor device, comprising forming a first metal film over a substrate, forming a second metal film over the first metal film, forming a low-melting-point metal film over the second metal film, thermally treating the low-melting-point metal film to form spherical agglomerates, forming a dielectric film over the agglomerates, forming a third metal film over the dielectric film, and etching the third metal film, the dielectric film, the agglomerates, an oxide film, and the first metal film.

The second metal film may be formed of Ru.

After forming the second metal film, the method may further comprise oxidizing the second metal film, and such oxidizing may be performed by thermally treating the second metal film at 300~400° C. in an atmosphere of $N_2O$ or $O_2$ gas.

The low-melting-point metal film may be formed of Zn or Sn.

The low-melting-point metal film may be formed through atomic layer deposition or the like.

The thermal treating may be performed at a temperature equal to or less than 200° C. in an inert gas atmosphere.

As such, the inert gas may comprise at least one selected from among Ar, He, Ne, Kr, Xe, and Rn.

The dielectric film may be formed in a thickness of about 100 Å.

BRIEF DESCRIPTION OF THE DRAWINGS

Example

DETAILED DESCRIPTION

Figure 1:
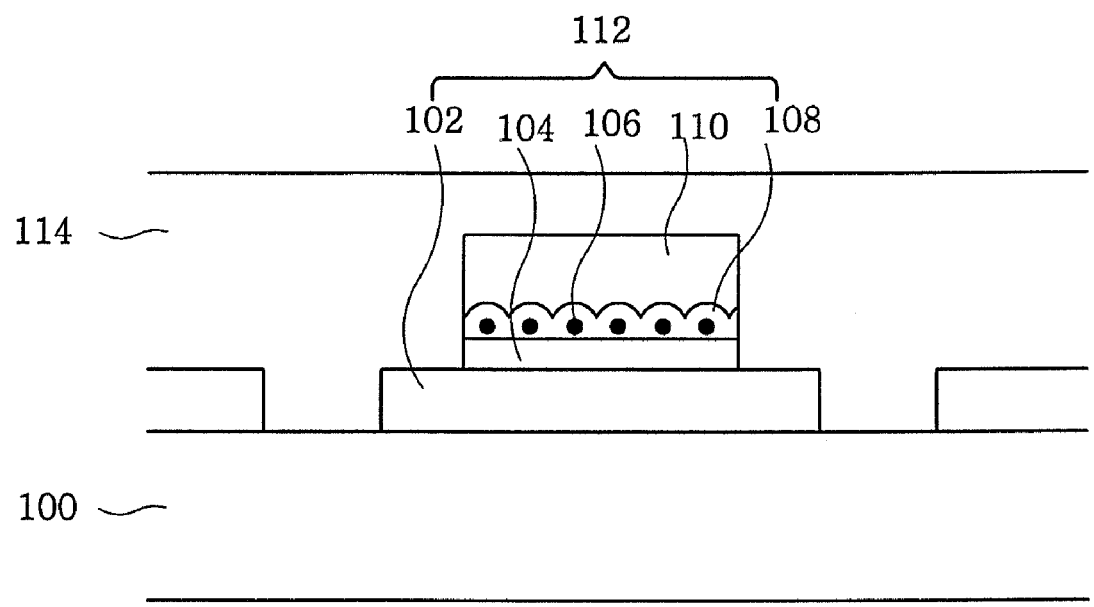
FIG. 1 illustrates a cross sectional view of a capacitor in a semiconductor device, according to embodiments; and Example FIGS. 2 to 4 sequentially illustrate cross sectional views of the process of manufacturing a semiconductor device, according to embodiments.

In the drawings, thicknesses are exaggerated in order to clearly depict the plurality of layers and regions, wherein like parts appearing in the drawings are represented by like reference numerals.

FIG. 1 illustrates a cross sectional view of the structure of a capacitor in a semiconductor device, according to embodiments.

As illustrated in FIG. 1, a capacitor 114 is composed of a lower electrode 102, a diffusion barrier 104, agglomerates 106, a dielectric layer 108, and an upper electrode 110.

Specifically, as illustrated in the drawing, the lower electrode 102 is formed over the substrate 100.

The substrate includes semiconductor elements (not shown) and/or metal wires, or the like, which may be electrically connected to the semiconductor elements. The lower electrode 102 is also electrically connected to the semiconductor elements and/or metal elements on the substrate. The lower electrode 102 may be formed of a single layer consisting of W, Al or Ti, or of multiple layers or sublayers consisting of TiN or TaN.

The diffusion barrier 104 is formed over the lower electrode 102, and a plurality of agglomerates 106 are formed over the diffusion barrier 104.

The diffusion barrier 104 functions to prevent the diffusion of metal atoms located above the diffusion barrier 104 to the lower film, or of metal atoms located under the diffusion barrier 104 to the upper film. Such a diffusion barrier 104 is formed of Ru or $RuO_2$ in a thickness of 10~1,000.

The agglomerates 106 may be formed in a spherical shape to increase the surface area of the film over the agglomerates 106. A low-melting-point metal, such as Zn or Ru is aggregated to form agglomerates 106. Further, the agglomerates 106 may or may not be uniformly distributed over the diffusion barrier 104. The projected area of all of the agglomerates 106 constitutes 40~60% of the area of the diffusion barrier 104.

The dielectric layer 108 and the upper electrode 110 are layered on the agglomerates 106. Since the agglomerates are spherical, the surface area of dielectric layer 108 formed over the surface of the agglomerates is increased. Moreover, the dielectric layer 108 has an uneven surface due to the agglomerates 106, and the average thickness thereof may be, for example, about 100 Å.

The dielectric layer 108 may be formed of a single layer or a double layer consisting of at least one of $Si_3N_4$, $SiO_2$, $Ta_2O_5$, $TiO_2$, PZT, PLZT, and $BaTiO_3$.

As in the lower electrode, the upper electrode 110 may be formed of a single layer consisting of W, Al, Ti, or the like, or of multiple layers or sublayers consisting of TiN, TaN, or the like.

A barrier metal layer (not shown) may be further formed between the upper electrode 110 and the dielectric layer 108 in order to increase contact properties and prevent the migration of metal atoms of the upper electrode 110. The barrier metal layer may be formed of one or more layers consisting of Ti or TiN.

In embodiments, it is easy to increase the surface area of the dielectric layer 108 using the agglomerates. Thereby, the capacitance of the capacitor may be readily increased without changing the design of the semiconductor device or the interlayer structure thereof.

An insulating layer, for example TEOS (tetra ethyl ortho silicate), is formed on the upper electrode 110 to cover the capacitor 114.

The method of manufacturing the capacitor in the semiconductor device is described below, with reference to the appended drawings.

Figure 2:
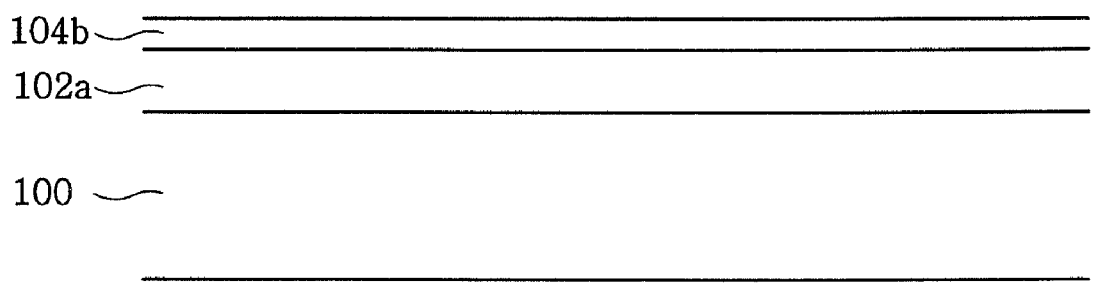
Figure 3:
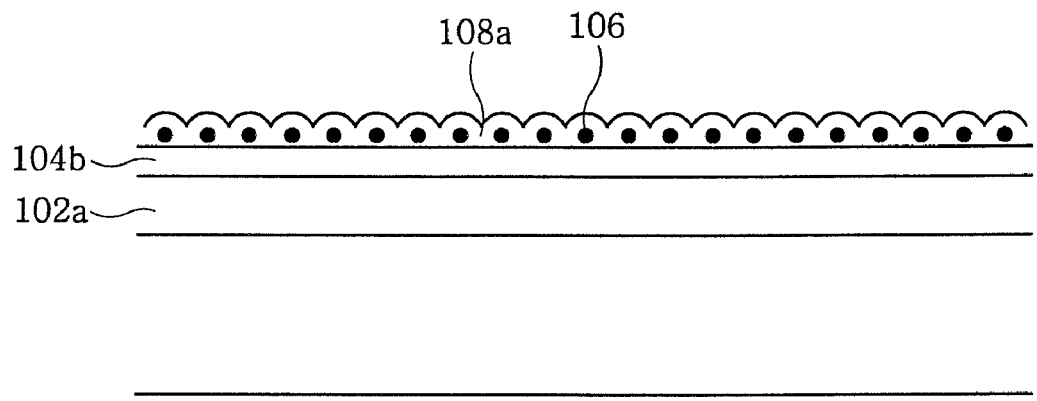
Figure 4:
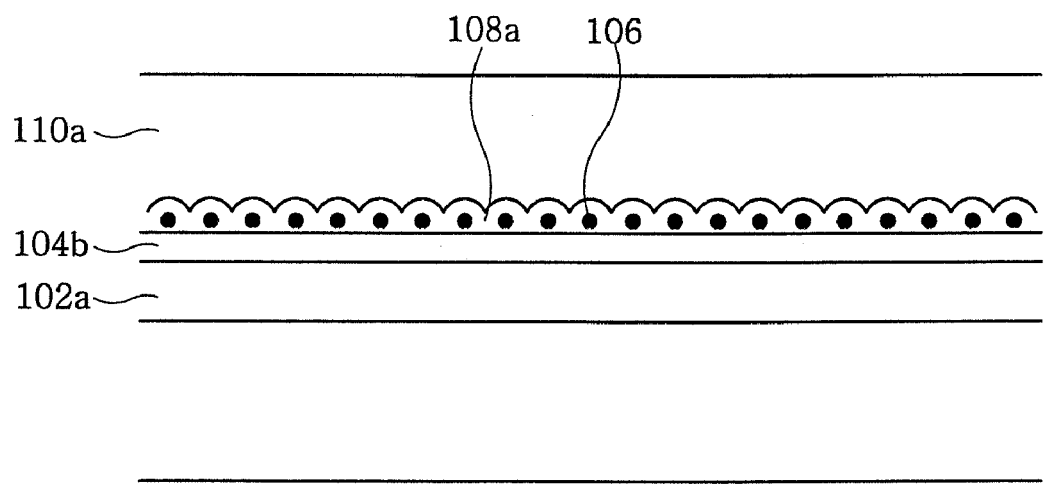

Example FIGS. 2 to 4 sequentially illustrate cross sectional views of an example of a process of manufacturing the capacitor, according to embodiments.

As illustrated in FIG. 2, a first metal film and a second metal film are layered over a substrate 100 through sputtering or the like. The first metal film 102a may be formed of W, and the second metal film 104a may be formed of Ru.

Thereafter, the second metal film 104a may be oxidized through thermal treatment at 300~400° C. in a plasma atmosphere of $O_2$ or $N_2O$, thus forming an oxide film 104b composed of, for example, $RuO_2$.

As illustrated in example FIG. 3, a low-melting-point metal, for example Sn, is deposited over the oxide film 104b, thus forming a low-melting-point metal film. In this example, a layer of Sn 200 Å thick is formed through atomic layer deposition or the like.

Subsequently, the low-melting-point metal film is agglomerated to form spherical agglomerates 106. The low-melting-point metal film may be agglomerated, for example, through thermal treatment at a temperature equal to or less than 200° C. in an inert gas atmosphere. The reason the film agglomerates is to decrease the surface energy of the thin film. If the temperature is higher than 200° C., the thin film does not agglomerate, but evaporates.

As such, the inert gas includes at least one gas selected from among Ar, He, Ne, Kr, Ze, and Rn.

Further, a dielectric material is deposited over the agglomerates 106, thus forming a dielectric film 108a. The dielectric film 108a is formed with a thickness of about 100 Å along the surface of the agglomerates 106. Furthermore, since the dielectric film 108a is unevenly formed, the surface area thereof is enlarged.

As illustrated in FIG. 4, a metal is deposited over the dielectric film 108a through sputtering or the like, thus forming a third metal film 110a. The third metal film 110a may be composed of W.

Then, as illustrated in FIG. 1, the third conductive film 110a, the dielectric film 108a, the agglomerates 106, the oxide film 104b, and the first conductive film 102a are etched through a selective etching process, thereby completing a capacitor composed of the upper electrode 110, the dielectric layer 108, the agglomerates 106, the diffusion barrier 104 and the lower electrode 102.

Depending on the design of the capacitor, the lower electrode 102 may be wider than the upper electrode 110, or it may be the same width.

Thereafter, an oxide material, or the like, is deposited to cover the capacitor 114, thus forming an interlayer insulating film 112. The interlayer insulating film may be formed with a thickness of 5000~6000 Å, for example. Moreover, processes of forming metal wires, metal lines, metal connections and/or an interlayer insulating film may be further conducted, if necessary.

As described hereinbefore, embodiments relate to a capacitor in a semiconductor device and a manufacturing method thereof. According to embodiments, spherical agglomerates are formed to increase the surface area of a dielectric layer, such that the capacitance of the capacitor can be easily increased without changing the design of the semiconductor device or the structure thereof, thereby providing a semiconductor device having high quality.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method of manufacturing a capacitor in a semiconductor device, comprising:
   forming a first metal film over a substrate;
   forming a second metal film over the first metal film;
   forming a low-melting-point metal film over the second metal film;
   thermally treating the low-melting-point metal film to form spherical agglomerates;
   forming a dielectric film over the agglomerates;
   forming a third metal film over the dielectric film; and
   etching the third metal film, the dielectric film, the agglomerates, the second metal film and the first metal film.

2. The method of claim 1, wherein the second metal layer is in an oxidized state, and wherein said etching said second metal layer comprises etching an oxidized metal layer.

3. The method of claim 1, wherein the second metal film is formed of Ru.

4. The method of claim 3, further comprising oxidizing the second metal film, after forming the second metal film, in which the oxidizing is performed by thermally treating the second metal film at 300~400° C. in an atmosphere of $N_2O$ or $O_2$ gas.

5. The method of claim 1, wherein the low-melting-point metal film is formed of Zn or Sn.

6. The method of claim 1, wherein the low-melting-point metal film is formed through atomic layer deposition.

7. The method of claim 1, wherein said thermally treating is performed at a temperature equal to or less than 200° C. in an inert gas atmosphere.

8. The method of claim 7, wherein the inert gas comprises at least one of Ar, He, Ne, Kr, Xe, and Rn.

9. The method of claim 1, wherein the dielectric film is formed with a thickness of about 100 Å.

* * * * *